United States Patent [19]

Schmitt

[11] Patent Number: 5,039,353

[45] Date of Patent: Aug. 13, 1991

[54] PROCESS FOR IMPROVING THE SPECTRAL RESPONSE OF A PHOTOCONDUCTIVE STRUCTURE, AND IMPROVED SOLAR CELL AND PHOTORECEPTIVE STRUCTURE

[75] Inventor: Jacques Schmitt, La Ville Du Bois, France

[73] Assignee: Societe Dite: Solems (Societe Anonyme), Palaiseau, France

[21] Appl. No.: 512,867

[22] Filed: Apr. 23, 1990

[30] Foreign Application Priority Data

Apr. 27, 1989 [FR] France .................................. 8905602

[51] Int. Cl.$^5$ ............................................. H01L 31/078
[52] U.S. Cl. ..................................... 136/249; 136/255; 136/258; 136/259; 357/30
[58] Field of Search .......... 136/249 TJ, 255, 258 AM, 136/259; 357/15, 30 C, 30 J, 30 K, 30 L, 30 N

[56] References Cited

U.S. PATENT DOCUMENTS

| | | | |
|---|---|---|---|
| 4,167,015 | 9/1979 | Hanak | 357/16 |
| 4,376,228 | 3/1983 | Fan et al. | 136/255 |
| 4,471,155 | 9/1984 | Mohr et al. | 136/258 |
| 4,514,583 | 4/1985 | Izu et al. | 136/259 |
| 4,728,370 | 3/1988 | Ishii et al. | 136/258 |

FOREIGN PATENT DOCUMENTS 58-10871  1/1983  Japan ................................. 136/258

OTHER PUBLICATIONS

Japanese Patent Abstracts, Apr. 8, 1983 vol. 7, No. 84 (E-169) (1229), Amorphous Solar Battery (58-10871, issued 1/21/83).

*Primary Examiner*—Aaron Weisstuch
*Attorney, Agent, or Firm*—Morrison Law Firm

[57] ABSTRACT

The invention is aimed at improving the spectral response of a photoconductive structure intended to receive a luminous radiation and comprising a substrate (3), an electrically conductive transparent layer (5), a photoelectric conversion semiconductive layer (7) in which is incorporated at least one complementary semiconductive sublayer (13a, 13b, 13c) which has an optical absorption threshold and an electrical charge diffusion length which are lower than those of the materials constituting the photoelectric conversion layer, According to the invention, the complementary sublayers (13a, 13b, 13c, etc.) are incorporated in the immediate neighborhood of several of the regions where the square of the optical electrical field of the stationary waves produced by the combination of the incident and reflected luminous radiations is at a maximum. The invention applies in particular to the manufacture of solar cells and other photoreceptive structures.

12 Claims, 4 Drawing Sheets

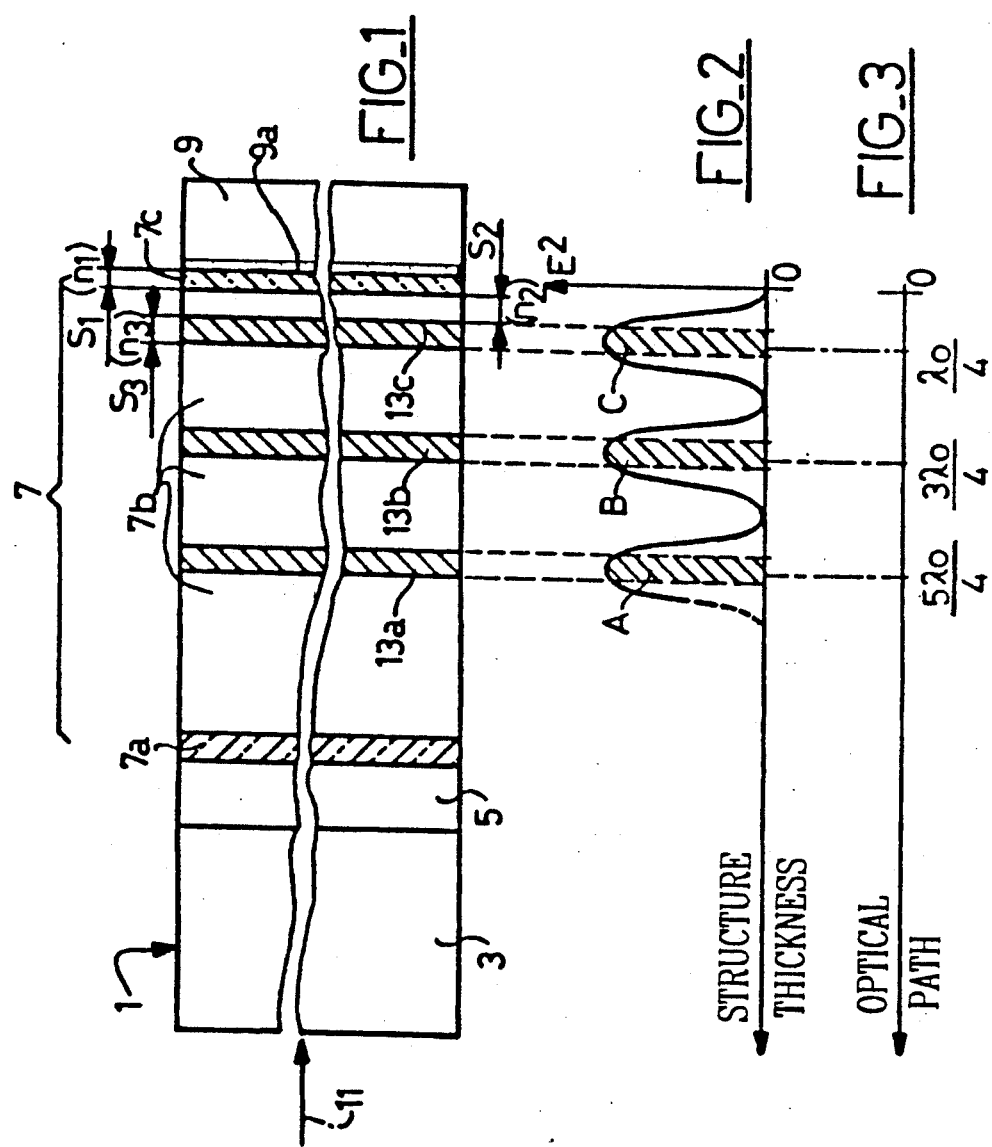

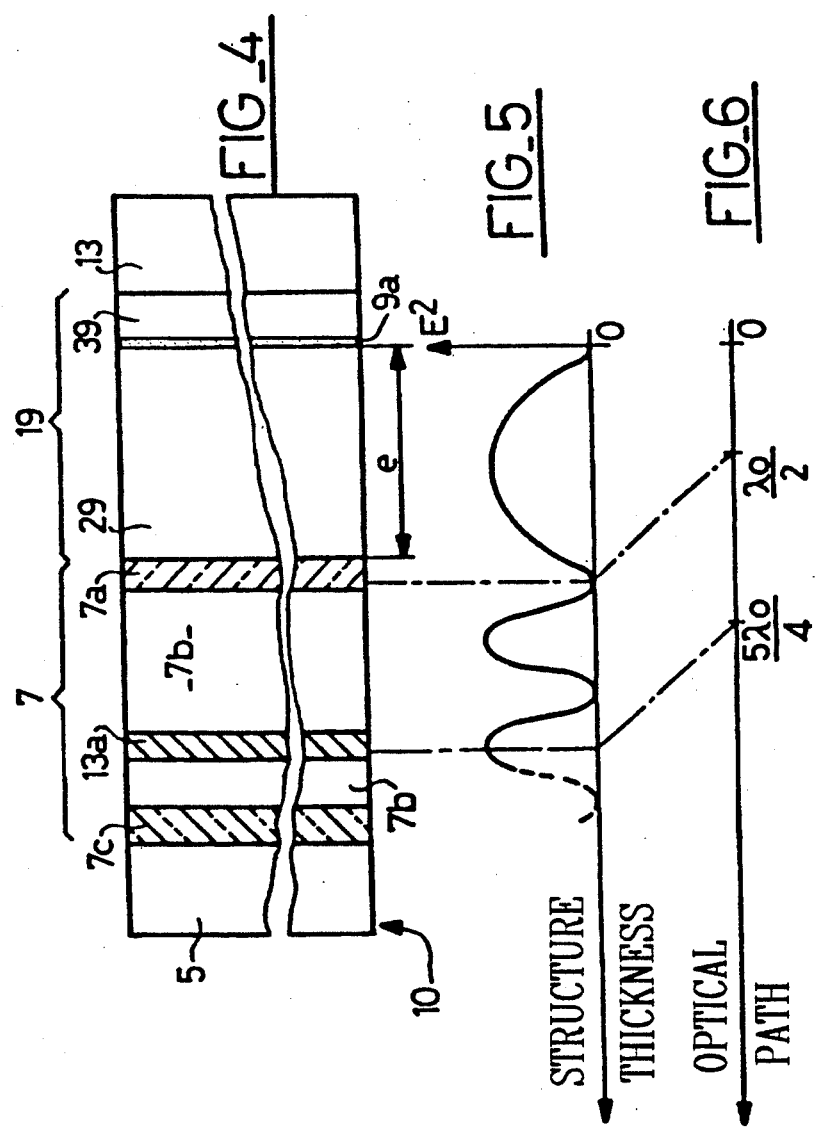

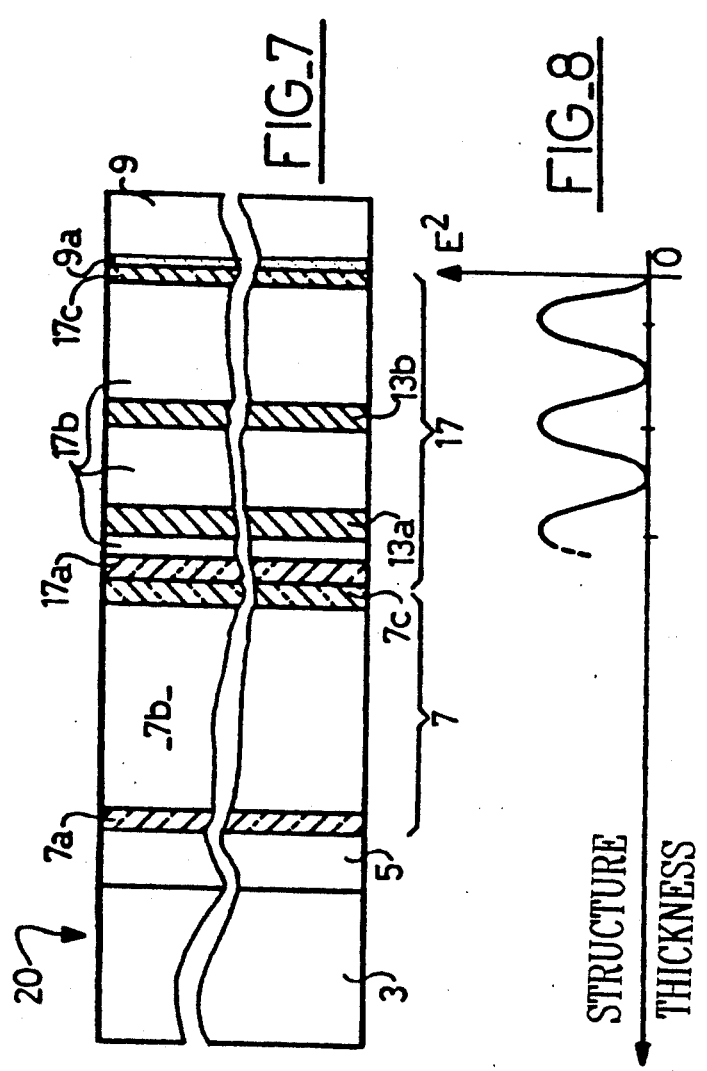

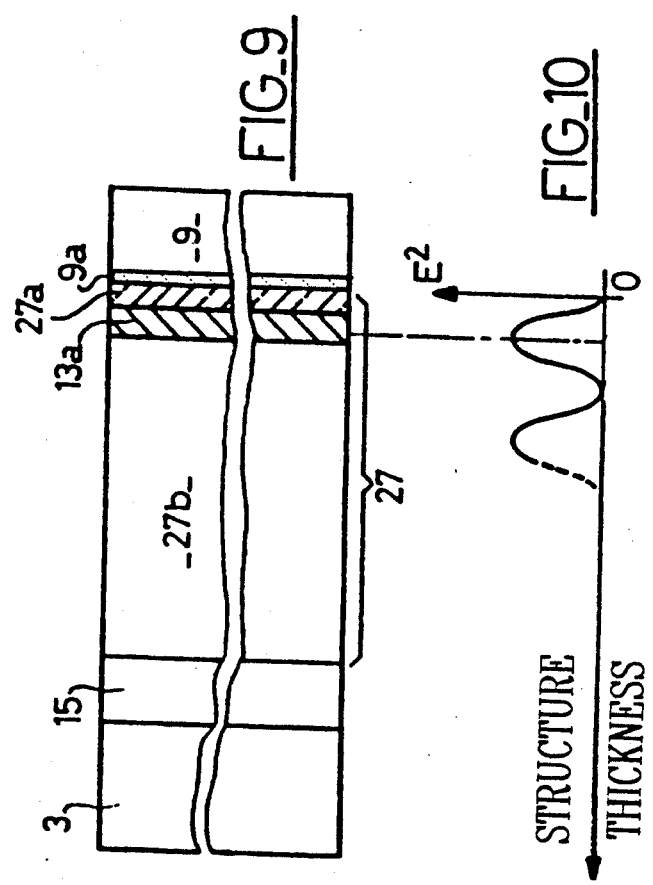

PROCESS FOR IMPROVING THE SPECTRAL RESPONSE OF A PHOTOCONDUCTIVE STRUCTURE, AND IMPROVED SOLAR CELL AND PHOTORECEPTIVE STRUCTURE

BACKGROUND OF THE INVENTION

The invention relates firstly to a process for improving, in a defined wavelength band, the spectral response of a photoconductive structure exposed to a luminous radiation.

In addition, the subject of the invention is an improved photoreceptive multilayer structure and a solar cell made of "single" thin films or of the type referred to as "tandem" or "multijunction".

It is perfectly well known today that photoconductive structures, such as solar cells, which are intended to receive luminous radiations are constructed around at least one photoelectric conversion layer consisting of a semiconductor material which absorbs the incident light photons when the electrical energy of these photons is higher than the optical absorption threshold of the semiconductor in question.

It will be recalled, here and now, that the optical absorption threshold, also called "optical gap" in the case of a semiconductor, corresponds to a photon energy threshold. In the case of a monochromatic light whose photon energy is lower than this threshold, the material is transparent; on the other hand, in the case of an energy higher than the threshold, the material is absorbent. In practice, and to the extent that the transition is not strictly sharp and that the concept of transparency depends on the thickness of the material, we shall define this threshold at an optical absorption of the order of 60% in the case of a semiconductor layer whose thickness is typical of those employed in thin-layer, that is approximately 1-micron, photoelectric structures.

The absorption threshold may be defined by the wavelength (in vacuum) of the light of same energy. Since energies and wavelengths are inversely proportional, the wavelengths which are shorter (bluer) than the threshold will be absorbed, whereas longer (redder) wavelengths will pass through most of the structure without absorption, and therefore without triggering the photoelectric processes which activate this structure.

It will also be noted that in what follows the name "spectral band" of a photoelectric structure will be given to the wavelength region in the case of which the structure actually converts into electrical current the light it receives.

As to the expression "charge diffusion length", this will define the average distance travelled by the charges (free carriers) within the semiconductor in question before these charges disappear by recombination (between the electrons and the holes).

The typical example which is to follow will allow these various concepts to be clarified. The case chosen refers to a solar cell containing amorphous silicon (aSi:H) of p-i-n type; that is to say whose photoelectric conversion layer comprises an intrinsic (i type) semiconductive sublayer inserted between a sublayer of p type and a sublayer of n type.

With this type of cell the optical absorption threshold is limited towards the red light by the optical absorption threshold of amorphous silicon.

While the wavelengths corresponding to a blue light are absorbed after a few tens of nanometres (1 nm $=10^{-9}$ m) in the amorphous silicon layer, the wavelengths corresponding to a green light are absorbed only after a path length of a few hundred nanometres. In contrast, a "deep" red light (wavelength of the order of 700 nm) is absorbed only after having travelled a few microns in the material.

In order to broaden the spectral band and to push back towards the red the operating limit of photoelectric structures containing a semiconductor (solar cells, photodetectors, etc.), it has already been proposed to increase the thickness of these structures up to the technically acceptable threshold (a few microns).

It was quickly noted, however, that problems then appeared which were due to the relative imperfection of the semiconductors employed (in particular aSi:H), in terms of electron-hole electrical charges: if the photoelectric conversion layer is thick, the electron-hole pairs are intrained by a relatively weak electrical field, this being over a relatively long distance, and these pairs remain for a relatively long time in the semiconductor, where their lifetime is of the order of the duration of the charge recombination processes within the material. In this case, the electrical charges are therefore lost before being collected.

Insofar as the wavelength ranges corresponding to red light are more particularly concerned, it is now considered that a sublayer of i (intrinsic) type from 0.3 to 0.5 microns in thickness is sufficiently thick to collect a considerable part of the red light photons in the visible spectrum, while remaining sufficiently thin for the collection efficiency and the fill factor to remain acceptable.

It will be noted that, in order to obtain a photovoltaic yield of more than 10% in sunlight, various technical improvements have been proposed, which tend to circumvent the problem of optical absorption.

In particular, provision has been made for producing structures with a contact, or rear electrode, with a reflective surface which has a very high reflectivity, in order to at least double the optical path (for example in red light). Provision has also been made for roughening the mutual contact surfaces of the layers so as to obtain a diffusion of light and to produce its optical trapping within the structure in the wavelength range in question.

It will be noted that, in the case of solar cells, increasing the spectral response in red light is of major importance for the photovoltaic yield, since the sunlight to which these cells are exposed contains a very large proportion of "red" photons.

In particular, in order to extend the spectral band towards the red, a solution has particularly been proposed, consisting in integrating or incorporating into the semiconductor employed (based, for example, on amorphous silicon), a complementary semiconductor such as a silicon-germanium alloy which has an absorption threshold and a charge diffusion length which are lower than those of the first semiconductor referred to.

While in principle this solution appears highly attractive (the spectral band is, in fact, extended towards the red), the overall balance has, however, turned out to be negative, since the addition of the complementary semiconductor entails a lowering of the overall photoelectric current which can be supplied by the structure.

OBJECTS AND SUMMARY OF THE INVENTION

The objective of the invention is to make the introduction of the complementary semiconductor profitable. The main concept of this invention consists in incorporating the complementary semiconductor with a lower optical absorption threshold only in places where the density of the photons to be absorbed in the wavelength range in question is the greatest.

More precisely, the process of the invention is aimed at improving, in a defined wavelength band, the spectral response of a photoconductive structure exposed to a luminous radiation and comprising in succession:
- an electrically conductive transparent layer,
- a photoelectric conversion layer made up of a semiconductor material, advantageously of amorphous or possibly polycristalline type,
- and a rear electrode with a reflecting surface making it possible to reflect towards the preceding layers an incident radiation after the latter has passed through the said layers, to obtain stationary combined waves, this process consisting in incorporating in, or at the surface of, the photoelectric conversion layer at least one complementary sublayer of lower thickness, made up of another semiconductor material which has an optical absorption threshold and an electrical charge diffusion length which are lower than those of the material(s) which constitute(s) the photoelectric conversion layer, the process of the invention being characterized in that the complementary sublayer(s) is (are) incorporated in the immediate vicinity of one, or of several, of the regions where the square of the optical electrical field of the stationary waves produced by the combination of the incident and reflected luminous radiations is at its maximum.

According to the invention, the complementary sublayer which is closest to the reflecting surface will be arranged so that the average optical path between this reflecting surface and the middle of the said complementary sublayer is equal to approximately $\lambda_0(\frac{1}{4}+k/2)$, the optical path separating the complementary sublayers from each other being equal, in the case where several of these sublayers are incorporated, to approximately $\lambda_0/2$; k being an integer which is positive or zero, generally between 0 and 3, and $\lambda_0$ being the average wavelength of the luminous (solar) radiation in vacuum and in the wavelength band in question (type of light to be absorbed), the said band being situated between the optical absorption thresholds of the semiconductor materials constituting the photoelectric conversion layer of the structure and the complementary sublayers, respectively.

As mentioned above, the invention also relates to a photoreceptive multilayer structure and to a solar cell of p-i-n or n-i-p type or else of the tandem type.

Within the scope of the invention it will be noted that the abovementioned photoreceptive multilayer structure comprises a stack of thin layers made up of:
- an electrically conductive transparent layer forming a Schottky barrier,
- a photoelectric conversion layer formed on the said transparent layer and made up of a semiconductor material, the said photoelectric conversion layer comprising a first sublayer of i type and a second sublayer of n type,
- at least one complementary sublayer such as defined above and formed in, or on, the i sublayer,
- a rear electrode with a reflecting surface, formed on the photoelectric conversion layer,
- and a substrate formed either on a face of the transparent layer away from that where the photoelectric conversion layer is formed (in this case the substrate will be transparent), or on a face of the rear electrode away from that where the said electrode is formed on the photoelectric conversion layer, this structure being characterized by the fact that the complementary sublayer(s) is (are) arranged in, or at the surface of, the sublayer of i type in the immediate vicinity of one, or of several, of the regions where the square of the optical electrical field of the stationary waves produced by the combination of the incident and reflected luminous radiations is at its maximum.

It will be possible to obtain numerous advantages by virtue of the invention, and especially:

a. it will be possible to maintain the electronic properties of the structure at a wholly acceptable level, the complementary semiconductor with a lower optical absorption threshold being integrated into this structure only in appropriate places where it produces its best efficiency, while reducing to a minimum its negative effect on the transport of the electrical charges within the layers;

b. the luminous band photons which must be absorbed by the sublayer of complementary material are contained in a relatively narrow wavelength band included between the optical absorption thresholds of the two semiconductors employed to constitute the photoelectric conversion layer and the complementary sublayer respectively. In the case of aSi:H and of aSi-Ge:H, this corresponds approximately to a band width of the order of 650 to 760 nm;

c. with a rear reflective surface of high reflectivity and by virtue of the low optical absorption level of the "main" semiconductor, a given luminous wave (for example of red light) will be able to provide a stationary wave whose position and form it will be possible to define precisely;

d. because of the combination or of the interference of the incident and reflected stationary waves, the luminous intensity (corresponding to the square of the local optical field) is zero in the immediate vicinity of the reflecting surface and exhibits, within the various layers forming part of the structure, a series of minima and maxima distributed according to a substantially regular spatial period (which can be typically situated approximately between 85 and 95 nm in an aSi:H layer, in the case of an average wavelength of the order of 720 to 730 nm);

e. because of the high optical index of the semiconductor materials employed (such as silicon and silicon-germanium alloy), the luminous wave is always substantially normal to the semiconductor, this being even when the light enters the structure at a high incidence angle. As a result, the interference period of the incident and reflected waves shows very little dependence on the value of the angle of incidence;

f. bearing in mind the abovementioned characteristics, it will be possible for the number of the complementary sublayers to be chosen at will as a function of the intended application (type of structure, spectral band in question, nature of the semiconductors, etc.).

Other characteristics and advantages will also become apparent from the description which is to follow, made with reference to the attached drawings, in which:

BRIEF DESCRIPTION OF THE DRAWINGS

FIG. 1 illustrates diagrammatically a solar cell in accordance with the invention, of n-i-p-type, FIG. 2 shows the variation of the square of the optical electrical field of the stationary waves produced within the structure by the combination of the incident and reflected luminous radiations, over the thickness of the structure of FIG. 1, FIG. 3 shows, in relation with FIGS. 1 and 2, the correspondence existing between the position of the complementary sublayers and the optical path within the structure of FIG. 1 (the scale ratio between FIGS. 2 and 3 corresponding to the optical index of the layers in question), FIG. 4 illustrates an alternative embodiment of the solar cell illustrated in FIG. 1, the cell illustrated in this FIG. 4 being of the p-i-n type with rear substrate, FIG. 5 shows the graph of variation of the square of the optical electrical field of the stationary waves produced by the combination of the incident and reflected luminous radiations travelling in the cell of FIG. 4, FIG. 6 illustrates, in relation with FIGS. 4 and 5, the correspondence existing between the variation in the optical electrical field over the thickness of the structure and the optical path within the latter (the scale ratio of FIGS. 4 and 5 corresponds to the optical index of the layers in question), FIG. 7 shows another alternative embodiment of a solar cell according to the invention, of the n-i-p tandem type, FIG. 8 shows, like FIGS. 2 and 5, the graph of variation of the square of the optical electrical field through the cell of FIG. 6, FIG. 9 illustrates a multilayer photoreceptive structure in accordance with the invention, and FIG. 10 shows, like FIGS. 2, 5 and 8, the variation of the square of the optical electrical field in the structure of FIG. 9.

Let us first consider FIGS. 1 to 3.

DETAILED DESCRIPTION OF THE PREFERRED EMBODIMENT

The solar cell indicated as a whole by 1 and illustrated in FIG. 1 comprises, successively, a transparent supporting or substrate layer 3, made of glass or of equivalent material, an electrically conductive transparent layer 5 consisting, for example, of a film of tin oxide or of zinc oxide formed on the substrate 3, a photoelectric conversion layer or laminate 7 formed on the transparent layer 5 by successive layerings of a first electrically conductive doped sublayer of n type, 7a, of a second conductive sublayer of i type (intrinsic layer with a low concentration of impurities), 7b, and of a third conductive doped sublayer of p type, 7c, each of these sublayers being made up of a semiconductor, especially amorphous, such as a-Si:H—(amorphous silicon). A so-called rear electrode, 9, formed on the sublayer of p type, 7c, completes the cell. In the present case, the electrode 9 is metallic (aluminum, silver or equivalent) and in contact with the sublayer of p type, 7c, has a reflective surface 9a capable of reflecting towards the above layers of the cell an incident radiation shown diagrammatically by the arrow 11, after this radiation has passed through the various layers, so as to obtain within the cell incident and reflected stationary combined waves which have been illustrated in FIG. 2.

In FIG. 1 it will also be noted that within the sublayer of i type, 7b, are incorporated three conductive complementary sublayers 13a, 13b, 13c of i type (or possibly very slightly doped), each of which has a thickness which is smaller than that of the i sublayer 7b. Each of said complementary sublayers is made up of a semiconductor material which has an optical absorption threshold (or an "optical gap") and a length of diffusion of the electrical charges (electron-hole pairs) which are created by the passage of the luminous radiation through the cell, which are shorter than either of those of the semiconductor essentially constituting the photoelectric conversion layer 7. In the case where the layer 7 is made from amorphous silicon, the complementary sublayers 13a, etc., will then preferably be made up of a silicon-germanium (Si-Ge) alloy.

If FIGS. 1 to 3 are compared, it is immediately seen that the arrangement of the complementary sublayers 13, 13b, 13c is not random, but that, on the contrary, the complementary sublayers in question are in this case and in accordance with the invention incorporated in the i sublayer, 7b, in the immediate neighborhood of some of the regions where the square of the optical electrical field $E^2$ of the stationary waves produced by the combination of the incident and reflected luminous radiations is at its maximum.

In the case which is illustrated it will be noted that the three complementary sublayers in question have been incorporated coincident with each of the three first regions, A, B and C respectively, which are closest to the reflecting surface 9a where the absolute value of the optical electrical field of the abovementioned stationary waves is at its maximum; that is to say that the first complementary sublayer (13c in this case) which is that closest to the reflecting surface 9a has been arranged so that the average optical path between the reflecting surface in question and substantially the middle of this same sublayer is equal to approximately $\lambda_0(\frac{1}{4}+k/2)$, the average optical path separating from each other the following complementary sublayers (13b, 13a) being equal to approximately $\lambda_0/2$, with, in this case, k (an integer)=0, $\lambda_0$ denoting, of course, the average wavelength in vacuum of the luminous radiation received by the cell.

Furthermore, from FIGS. 2 and 3 it is clearly apparent that the middles of sublayers 13c, 13b and 13a are situated so that the corresponding optical paths are equal to $\lambda_0/4$, $3\lambda_0/4$ and $5\lambda_0/4$ respectively (reference being taken on the reflecting surface 9a: origin of the abscissa of the curves illustrated in FIGS. 2 and 3).

To avoid any ambiguity, it will be recalled that the average optical path (Pa) can be defined as:

$$Pa = \int_i n_i ds;$$

that is to say:

$$Pa = n_1 s_1 + n_2 s_2 + n_3 s_3 + \text{etc}$$

with $n_i$: local optical refractive index in the layer or sublayer in question ($n_1$, $n_2$ etc.)

r: route followed by the luminous radiation along the optical path, s: distance travelled by the luminous radiation in question within a material which has a specified refractive index (in the cases illustrated in the present application, this distance corresponds to the thicknesses of each of the layers and sublayers constituting the photoconductive structure, since the layers are arranged substantially perpendicularly to the incident radiation).

In practice, the determination of the regions where the complementary sublayers are liable to be deposited will be relatively simple. It will be sufficient, in fact, first of all to determine the optical refractive index (n) of each of the materials making up the various layers (or sublayers) to be deposited during the manufacture of the structure, this being for a relatively limited wavelength range corresponding to the chosen spectral band. The physical thickness of the deposited layers will then be controlled or measured, bearing in mind the deposition rate of the machines employed and the dimensions of the structures to be produced. The average optical path will then be calculated from the formula $Pa = \int_r n_i \cdot ds$, and the possible locations of integration of the sublayers will be deduced therefrom, in places where the square of the optical electrical field of the stationary waves within the structure is at its maximum, from the relationship $Pa = \lambda o(\frac{1}{4} + k/2)$.

Even though in FIG. 1 provision was made for integrating three complementary sublayers in the photoelectric conversion sublayer 7, it must be clear that this example does not in any way limit the number of the sublayers in question. Furthermore, other examples of embodiments have been envisaged in FIGS. 4, 7 and 9.

An alternative embodiment of the solar cell of FIG. 1 is illustrated in FIG. 4.

It will be noted that identical parts have been denoted with the same references for the sake of clarity.

In FIG. 4, therefore, an electrically conductive transparent layer 5, a photoelectric conversion layer 7 and a rear electrode referenced 19 can be seen again as a constitutent of the solar cell generally referenced 10.

In this cell, which is of the p-i-n type, the sublayer of p type, 7c, comes into contact with the transparent layer 5, while the layer of n type, 7a, comes into contact with the rear electrode 19, which is formed by a stack comprising an electrically conductive transparent layer 29 (preferably manufactured from a metal oxide) coming into contact with the sublayer of n type, 7a, and an electrically conductive layer 39 (of metal in particular) provided with a reflecting surface 9a formed on the conductive transparent layer 29. It will also be observed that the supporting or substrate layer 13 is here arranged at the rear of the cell, behind the electrically conductive layer 39. In this case the substrate can be opaque and may, for example, be made up of a metal, of a ceramic material or of a polymer.

In this embodiment it will also be observed that only one complementary sublayer 13a has been incorporated in the i sublayer, 7b, of the photoelectric conversion layer 7, and this sublayer has been arranged so that the average optical path between the reflecting surface 9a and the middle of the said sublayer 13a is equal to approximately $5\lambda o/4$ (see FIG. 6). In addition, the thickness e of the conductive transparent layer 29 has been optimized so as to make the stationary wave of FIG. 5 pass through a zero at $\lambda o/2$, at the n sublayer 7a. It will be noted that, in the example illustrated in FIG. 4, the layers 29 and 7b have optical refractive indices (n) approximately equal to 2 and 4 respectively, and this explains the offset between FIGS. 5 and 6. An arrangement of this kind could, of course, also have been provided in other types of photoreceptive structures such as, for example, that illustrated in FIG. 1.

Let us now consider FIG. 7, illustrating a different solar cell 20 of n-i-p tandem type.

Both n-i-p and p-i-n tandem (or multijunction) cells are well known. That illustrated in FIG. 7 is made up of a stack of thin layers successively comprising, starting from the side which receives the incident light, a transparent substrate 3, an electrically conductive transparent layer 5, a first photoelectric conversion layer 7 comprising, in this order, a sublayer of n type, 7a, a sublayer of i type, 7b, and a sublayer of p type, 7c. To this first photoelectric conversion layer 7 is added a second, also photoelectric conversion, layer 17, comprising an n sublayer, 17a, formed on the p sublayer, 7c, an i sublayer, 17b, and a p sublayer, 17c, on which is formed the reflecting surface 9a of a rear electrode 9. Electrodes of other types with a reflecting surface could, of course, have been employed, such as, for example, a stainless steel substrate with a polished surface acting as a mirror. In this case the transparent substrate 3 would no longer need to be provided.

More than two photoelectric conversion layers could also have been provided.

In accordance with the invention, two complementary sublayers 13a, 13b have in this case been integrated into the i sublayer, 17b, closest to the reflecting surface 9a, these sublayers being arranged in the immediate vicinity of the second and third maxima of the square of the optical electrical field of the stationary waves (see FIG. 8), so that the average optical path between the middle of the said complementary sublayers and the reflecting surface 9a is equal to $3\lambda o/4$ (sublayer 13b) and $5\lambda o/4$ (sublayer 13a) respectively.

Another type of photoreceptive multilayer structure belonging to a detector capable, for example, of detecting coherent luminous waves produced by a laser of solid type is shown in FIG. 9.

More precisely, the structure of FIG. 9 comprises a succession of thin layers consisting, starting with the region through which the structure is exposed to the light, of a transparent substrate 3, of an electrically conductive transparent layer 15 forming a Schottky barrier, of a photoelectric conversion layer 27 comprising a sublayer of i type, 27b, formed on the layer 15 and of a sublayer of n type, 27a, on the rear of which is formed the reflecting surface 9a of a metal electrode 9.

To form a Schottky barrier, the layer 15 will be sufficiently thin to allow the light to pass through it, while being sufficiently thick to ensure a planar electrical conductivity (that is to say in a direction substantially perpendicular to its thickness). A layer consisting of platinum, palladium or, for example, iridium and having a thickness of between approximately 5 and 10 nm would be quite suitable.

It will also be noted that in the case which is illustrated only one complementary layer 13a has been integrated in the intrinsic sublayer 27b. It so happens that, bearing in mind in particular the thickness of the sublayer of n type, 27a, the complementary sublayer 13a is situated at the surface of the sublayer 27b, directly in contact with the n sublayer, 27a, the average optical path between the middle of this sublayer 13a and the reflecting surface 9a still obeying the same formula $Pa = \lambda o/4 + k\lambda o/2$, with $k=0$ in this case (see FIGS. 9 and 10).

It is clear that this is only one example of embodiment among others, since one of the advantages of illuminating a structure with a coherent (laser) light is that of obtaining combined incident and reflected stationary waves which will be coherent over a long distance, consequently making it possible to increase the number of the complementary sublayers within the intrinsic sublayer(s) of the structures.

A few practical examples of embodiment will now be presented.

EXAMPLE 1

The task is to manufacture a monodiode of p-i-n type comprising a "single" rear mirror and two complementary sublayers.

The semiconductor materials employed are amorphous silicon (optical absorption threshold 1.96 eV, that is, approximately 633 nm) and a silicon-germanium alloy (of the order of 60% of Si and 40% of Ge) in the case of the complementary sublayers (absorption threshold 1.7 eV, that is, approximately 730 nm).

The spectral band aimed at is situated between 633 and 730 nm, centred at approximately 685 nm.

The optical refractive index (n) of amorphous silicon and of monocrystalline silicon in this wavelength region is of the order of 4. It will be noted that this is a region where this index changes very rapidly. The structure should therefore be optimized carefully by starting with accurate optical measurements and calculations.

However, the position of the various complementary sublayers can be estimated, with quite good accuracy:

sublayer (13b) closest to the mirror (reflecting surface 9a): $Pa = \lambda o(\frac{1}{4} + k/2)$, that is with $K=0$: $Pa = 685/4$, that is in "physical" thickness terms (with an optical index of 4): $1 \approx 43$ nm second sublayer (13a), $k=1$, $Pa = 3 \times 685/4$, that is $1 \approx 129$ nm.

The corresponding distances between the middle of the complementary sublayers and the reflecting surface 9a of the mirror will therefore be of the order of 43 and 129 nm.

The substrate (3) employed is made of soda-lime glass 1 to 4 nm in thickness.

The conductive transparent layer (5) is made of fluorine-doped $SnO_2$ and is approximately 45 nm in thickness. This layer has a rough surface in contact with the p sublayer (7a).

The photoelectric conversion sublayer (7) is comprises as follows:

boron-doped p sublayer approximately 15 nm in thickness,
i sublayer (intrinsic amorphous silicon) approximately 85 nm in thickness,
within the i sublayer, each of the two complementary sublayers (13b, 13a) based on aSi:H-Ge is of the order of 30 nm in thickness,
phosphorus-doped n sublayer, approximately 30 nm in thickness.

To manufacture such a structure, the optical properties of the materials employed and the deposition speed of the machine must be well known.

To begin with, the time needed to deposit, in the case of a given material, a specified optical thickness (thickness corresponding to the "physical" thickness but taking account of the optical index of the materials employed) must be calibrated by reflectometry.

With this calibration carried out, the process of manufacture is as follows:

the conductive transparent layer (5) is formed on the glass substrate. Its deposition is carried out by cathodic sputtering with a magnetron (temperature of the order of 50° to 100° C.),
the photoelectric conversion layer (7) is then formed on the $SnO_2$ layer using the photoelectric conversion layer using a CVD tape technique with plasma and parallel electrodes.

To form the p sublayer (referenced 7a in FIG. 1), a gaseous mixture based on $SiH_4$, $B_2H_6$ and $CH_4$ is, in a wholly conventional manner, introduced into the vacuum chamber of the plasma CVD apparatus and a "vacuum" deposit is produced with a gas pressure of the order of 4 Pa under a radio-frequency electrical power (13.56 MHz frequency and 10 mW/cm² power density). The electrical power is applied between the parallel electrodes of the apparatus (before introducing the gases, the vacuum prevailing in the depositing chamber was of the order of $10^{-4}$ Pa).

A p sublayer with a thickness of 5 nm, which is doped with boron and contains carbon, is thus deposited.

The gas mixture of the vacuum chamber is then replaced with silane ($SiH_4$) and the first part of the i sublayer (referenced 7b in FIG. 1) is formed to a thickness of 85 nm and at a pressure of 4 Pa.

The first complementary sublayer (13a) is then deposited under $SiH_4$, $GeH_4$ and $H_2$ atmosphere and over a thickness of 30 nm. As this layer begins to form, a reflectometry measurement centered at 685 nm is triggered off.

The second part of the i sublayer is then formed to a thickness of 60 nm (the deposition is continued until the reflectometry measurements show that the intensity of reflected light supplied by the source of monochromatic light has passed through one fringe).

The second complementary sublayer (13b) is then formed to a thickness of 30 nm.

After this, the silane gas is replaced with a gas mixture based on silane and $PH_3$ and the n sublayer (referenced 7c in FIG. 1) is formed to a thickness of 30 nm and at a pressure of approximately 4 Pa (deposition stopped when the reflectometer shows an offset of one additional half-fringe).

During the formation of the photoelectric conversion layer the temperature of the glass substrate was maintained in the region of 200° C.

Finally, the rear electrode with a reflecting surface is formed on the photoelectric conversion layer by vacuum deposition of an aluminium film 200 nm in thickness.

EXAMPLE 2

The materials employed are the same as in Example 1.

The structure, which is still of the p-i-n type, comprises only one complementary sublayer.

A conductive transparent layer based on $SnO_2$:F which has an optical index of the order of 2 and a thickness of approximately 117 nm is inserted between the reflecting surface (9a) of the rear mirror and the photoelectric conversion layer.

Attempts are still being made to improve the spectral response in the region of 685 nm.

The position of the complementary sublayer is calculated from the optical path by:

$Pa =$ (half-thickness of the complementary sublayer (1)) $\times$ (optical index of the aSi:H, Ge) + (thickness of the part (2) of the i sublayer made of aSi:H situated between the complementary sublayer and the n sublayer (3))×(optical index of the aSi:H)+(thickness of the layer of $SnO_2$:F (4))×(optical index of the $SnO_2$:F)≈3×685/2 (with k=1), that is, Pa≈514 nm.

The thickness taken will therefore be:
in the case of the sublayer (1): 40 nm (total thickness: 2×20 nm)
in the case of the sublayer (2): 20 nm
in the case of the sublayer (3) : 30 nm
in the case of the sublayer (4) : 117 nm With such thicknesses one obtains, in fact: Pa=(20×4)+(20×4)+(30×4)+(117×2)=514 nm.

It will be noted that, to be perfectly rigorous, this calculation shoud take into account the partial reflection of the luminous radiation at the location of the n/$SnO_2$:F interface, which reflects approximately 10% of the energy.

EXAMPLE 3

Same materials as in Example 1.

The structure produced is of the $SnO_2$/p-i-n(aSi:H)/p-i-n (aSi:H) tandem cell type, with two aSi:H-Ge/Ag sublayers.

The thicknesses of the various layers and sublayers are, in order, the following:

| $SnO_2$: | 45 to 50 nm | i (aSi:H): | 50 nm |
|---|---|---|---|
| p: | 15 nm | i (aSi:H—Ge): | 50 nm |
| i (aSi:H): | 90 nm | i (aSi:H): | 55 nm |
| n: | 20 nm | i (aSi:H—Ge): | 10 nm |
| p: | 15 nm | n: | 30 nm |
|  |  | rear electrode with reflecting surface: | 150 nm |

I claim:

1. Process for improving, in a defined wavelength band, the spectral response of a photoconductive structure intended to receive a luminous radiation and comprising in succession:
   an electrically conductive transparent layer (5, 15),
   a photoelectric conversion layer (7, 17, 27, 27') made up of a semiconductor material,
   and a rear electrode (9, 19, 29) with a reflecting surface (9a) making it possible to reflect towards the preceding layers incident radiation after the latter has passed through the said layers, to obtain stationary combined waves,
   the said process consisting in incorporating in, or at the surface of, the photoelectric conversion layer (7, 17, 27) at least one complementary sublayer (13a, 13b, 13c) of lower thickness, made up of another semiconductor material which has an optical absorption threshold and a length of diffusion of the electrical charges created by the passage of the luminous radiation through the structure which are lower than those of the material(s) constituting the photoelectric conversion layer, the said complementary sublayer(s) (13a, 13b, 13c, etc.) being incorporated in the immediate an neighborhood of one, or of several, of the regions (A, B, C) where the square of the optical electrical field ($E^2$) of the stationary waves produced by the combination of the incident and reflected luminous radiations reaches a maximum.

2. Process according to claim 1, according to which the complementary sublayer which is that closest to the reflecting surface (9a) of the electrode is arranged so that the average optical path (Pa) between the said reflecting surface and the said sublayer is equal to approximately $\lambda_o(\frac{1}{4}+k/2)$, the average optical path separating the complementary sublayers from each other, in the case where a number of these sublayers are provided, being equal to approximately $\lambda_o/2$, k being a positive relative integer or zero and $\lambda_o$ being the average wavelength of the luminous radiation in vacuum and in the wavelength band in question, the said band being situated between the optical absorption thresholds of the semiconductor materials constituting the photoelectric conversion layer and the complementary sublayers, respectively.

3. Process according to claim 2, in which the said incorporated complementary sublayer(s) is (are) of intrinsic (i) type.

4. Process according to claim 1, in which the said incorporated complementary sublayer(s) is (are) of intrinsic (i) type.

5. Multilayer photoreceptive structure comprising a stack of thin layers made up of:
   an electrically conductive transparent layer forming a Schottky barrier (15),
   a photoelectric conversion layer (27, 27') formed on the said transparent layer (15) and made up of a semiconductor material, the said photoelectric conversion layer comprising a sublayer of (i) type and a sublayer of (n) type,
   a rear electrode (9, 19) with a reflecting surface (9a) formed on the photoelectric conversion layer and making it possible to reflect towards the preceding layers incident radiation after the latter has passed through the said layers, to obtain stationary combined waves,
   at least one complementary sublayer (13a, 13b, 13c) formed in, or on, the sublayer of (i) type (27b) of the photoelectric conversion layer, the said complementary sublayer consisting of another semiconductor material which has an optical absorption threshold and a length of diffusion of the electric charges created by the passage of the luminous radiation through the structure which are lower than those of the material(s) forming the said photoelectric conversion layer, the said complementary sublayer(s) being arranged in the immediate neighborhood of one, or of several, of the region(s) where the square of the optical electrical field of the stationary waves produced by the combination of the incident and reflected luminous radiations reaches a maximum,
   and a substrate (3, 13) formed either on a face of the transparent layer (15) opposed to that where the photoelectric conversion layer is formed, in this case the substrate being transparent, or on a face of the rear electrode apposed to that where the said electrode is formed on the photoelectric conversion layer.

6. Structure according to claim 5, in which the said complementary sublayer is of intrinsic (i) type.

7. Solar cell intended to receive a luminous radiation and made up of a stack of thin layers comprising:
   an electrically conductive transparent layer (5),
   a photoelectric conversion layer (7, 17) formed on the transparent layer (5) and made up of a semiconductor material, the said photoelectric conversion layer comprising a sublayer of (i) type inserted between a sublayer of (p) type and a sublayer of (n) type, a rear electrode (9, 19) with a reflecting surface (9a) formed on the photoelectric conversion layer and making it possible to reflect towards the preceding layers incident radiation after the latter has passed through the said layers, to obtain stationary combined waves, at least one complementary sublayer formed in, or on, the sublayer of (i) type of the photoelectric conversion layer, the said complementary sublayer consisting of a semiconductor material which has an optical absorption threshold and a length of diffusion of the electrical charges created by the passage of the luminous radiation through the cell which are lower than those of the material(s) forming the photoelectric conversion layer, the said complementary sublayer(s) being arranged in the immediate neighborhood of one, or of several, of the regions where the square of the optical electrical field ($E^2$) of the stationary waves produced by the combination of the incident and reflected luminous radiations reaches a maximum, and a substrate (3, 13) formed either on a face of the transparent layer (5) opposed to that where the photoelectric conversion layer is formed, in this case the substrate bring transparent, or on a face of the rear electrode (19) opposed to that where the said electrode is formed on the photoelectric conversion layer.

8. Solar cell according to claim 5, in which the said complementary sublayer is of intrinsic (i) type.

9. Cell according to claim 8, in which the photoelectric conversion layer and the complementary sublayer(s) comprise silicon and an alloy of silicon and germanium respectively.

10. Cell according to claim 5, in which the photoelectric conversion layer and the complementary sublayer(s) comprise silicon and an alloy of silicon and of germanium respectively.

11. Cell according to claim 10, in which, to improve the spectral response in a wavelength range of between 630 and 760 nm, the said cell comprises between one and three complementary sublayers (13a, 13b, 13c) which are arranged in, or on, the said sublayer of (i) type, so that:

the thickness of the (each) complementary sublayer is approximately between 10 and 50 nm, the average optical path (Pa) which separates the reflecting surface (9a) of the electrode and the middle of the complementary sublayer closest to this same reflecting surface is equal to approximately 170 to 190 nm, and, in the case where the cell comprises two or three complementary sublayers, the distance between the respective middles of the said sublayers is of the order of 80 to 100 nm.

12. Solar cell of tandem type, intended to receive a luminous radiation and comprising a stack of thin layers made up of:

an electrically conductive transparent layer (5), a rear electrode (9) with a reflecting surface (9a) formed on the said transparent layer (5) and making it possible to reflect towards the preceding layers incident radiation after the latter has passed through the said layers, to obtain stationary combined waves, at least two photoelectric conversion layers (7, 17) made up of an amorphous semiconductor material and each comprising a sublayer of (i) type inserted between a sublayer of (n) type and a sublayer of (p) type, the said photoelectric conversion layers (7, 17) being formed one over the other, between the said transparent layer (5) and the rear electrode (9), a substrate (3) formed either on a face of the transparent layer (5) opposed to that where one of the photoelectric conversion layers is formed (7), in this case the substrate being transparent, or on a face of the rear electrode (9) opposed to that where the same electrode is formed on (one of) the other photoelectric conversion layer(s) (17), and at least one complementary sublayer of (i) type formed in, or on, at least one of the sublayers of (i) type, the said complementary sublayer consisting of a semiconductor material which has an optical absorption threshold and a length of diffusion of the electrical charges created by the passage of the luminous radiation through the cell which are lower than those of the material(s) constituting the photoelectric conversion layer, the said complementary sublayer(s) (13a, 13b) being arranged in the immediate neighborhood of one, or of several, of the regions where the square of the optical electrical field ($E^2$) of the stationary waves produced by the combination of the incident and reflected luminous radiations reaches a maximum.

* * * * *